United States Patent [19]
Sawai et al.

[11] Patent Number: 5,757,679
[45] Date of Patent: May 26, 1998

[54] METHOD AND APPARATUS FOR MODELLING MOS TRANSISTOR CHARACTERISTICS FOR SEMICONDUCTOR CIRCUIT CHARACTERISTIC ANALYSIS

[75] Inventors: Toshitsugu Sawai, Nara; Toshiro Akino, Osaka, both of Japan

[73] Assignee: Matsushita Electric Industrial Co., Ltd., Osaka, Japan

[21] Appl. No.: 681,417

[22] Filed: Jul. 23, 1996

[30] Foreign Application Priority Data

Aug. 1, 1995 [JP] Japan .................. 7-196349

[51] Int. Cl.⁶ ............................................. G06F 17/50
[52] U.S. Cl. ............................... 364/578; 364/490
[58] Field of Search ........................ 364/578, 489, 364/490; 323/314; 327/531

[56] References Cited

U.S. PATENT DOCUMENTS

| | | | |
|---|---|---|---|
| 5,345,401 | 9/1994 | Tani | 364/578 |
| 5,391,980 | 2/1995 | Thiel et al. | 323/314 |
| 5,434,532 | 7/1995 | Thiel | 327/531 |
| 5,459,673 | 10/1995 | Carmean et al. | 364/489 |

OTHER PUBLICATIONS

"Test Structures and Measurement Techniques for the Characterization of the Dynamic Behavior of CMOS Transistors on Wafer in the GHz Range", by Hanseler et al.
IEEE ICMTS 1992: Conference on Microelectronic Test Structures, vol. 5, Mar. 1992, pp. 90–93.
"Analysis of nonlinearities in MOS floating resistor networks", by G. Wilson and P. Chan, IEE Proceedings—Circuits, Devices and Systems, vol. 141, No. 2, Apr. 1994, pp. 82–88.

Yu–Hsu Chang et al., "Analystic Macromodeling and Simulation of Tightly Coupled Mixed Analog–Digital Circuits", Proc. of 1992 IEEE Conference on Computer–Aided Design, pp. 244–247, 1992.

Yung–Ho Shih et al., "Analytic Transient Solution of General MOS Circuit Primitives", IEEE Transactions on Computer–Aided Design, vol. 11, No. 6, pp. 719–731, Jun. 1992.

Yung Ho Shih et al., "A Fast Timing and Reliability Simulator for Digital MOS Circuits", IEEE Transactions on Computer–Aided Design of Integrated Circuits & Systems, vol. 12, No. 9, pp. 1387–1402, Sep. 1993.

*Primary Examiner*—Kevin J. Teska
*Assistant Examiner*—Russell W. Frejd
*Attorney, Agent, or Firm*—McDermott, Will & Emery

[57] ABSTRACT

A drain-source interconnection of a MOS transistor is represented by a parallel circuit formed of an electric current source and a resistor. The current of the electric current source, i, is represented by a polynomial of a difference $(V_{GS}-V_T)$ where $V_{GS}$ is the gate-source voltage and $V_T$ is the threshold voltage. The operation area of the MOS transistor is divided into a plurality of sub-operation areas according to the gate-source and drain-source voltages. Respective coefficients of the polynomial and respective conductance of the resistor element are stored for the sub-operation areas. A MOS transistor model is prepared so that $V_T$ is represented by a polynomial of $V_{BS}$, the substrate-source voltage of the MOS transistor. A circuit equation for a MOS transistor-containing semiconductor circuit is derived from the MOS transistor model. The circuit equation is analyzed.

14 Claims, 6 Drawing Sheets

$V_{GS} = V_{GST0} + V_T$ $V_{GS} = V_T$

METHOD AND APPARATUS FOR MODELLING MOS TRANSISTOR CHARACTERISTICS FOR SEMICONDUCTOR CIRCUIT CHARACTERISTIC ANALYSIS

BACKGROUND OF THE INVENTION

1. Technical Field

This invention relates to a characteristic analysis method for evaluating semiconductor circuit operating characteristics in the design of a semiconductor circuit with MOS transistors and to an analyzer for analyzing semiconductor circuit characteristics.

2. Background Art

Various simulation techniques for simulating the operating characteristics of semiconductor circuits containing MOS transistors have been developed.

Commonly-used simulation techniques may be categorized into the following three groups.

(a1) a numeric integral method of solving a circuit equation by means of iteration of a numeric calculation of timepoints, (a2) an analytic circuit simulation method of solving a circuit equation, and (a3) a technique of analyzing an entire semiconductor circuit including its MOS transistors as an RC network.

When the simulation rates of these three simulation techniques are compared, the simulation technique (a1) tends to have the fastest simulation rate. The simulation technique (a2) tends to have the second fastest simulation rate and the simulation technique (a3) tends to have the slowest simulation rate. On the other hand, when the analysis accuracy is considered, the three simulation techniques tend to be ranked in opposite order.

Non-linear element models (e.g., MOS transistors) may be divided into the following three categories:

(m1) non-linear model, (m2) piecewise linear model, and (m3) linear model

Although these three models (m1), (m2) and (m3) may be combined, in that order, with a fast simulation technique, the modelling accuracy tends to drop.

A typical, popular general circuit simulator, SPICE, employs a combination of (a1) and (m1) to perform analysis with great accuracy. SPICE, however, has the drawback that it has some analysis processing rate limitations. Due to this problem, SPICE is unable to find applications in large scale circuits.

With a view to solving such a problem associated with the SPICE circuit simulator, various approaches for speeding up circuit simulation have been proposed. For instance, an approach, which is based on a relaxation method such as ITA (iterated timing analysis) and WRM (waveform relaxation method), has been introduced. This approach, which aims at increasing the circuit simulation rate by means of circuit split, also employs a combination of (a1) and (m1), as a result of which the analysis processing rate is not improved very much in relation to the SPICE circuit simulator.

Meanwhile, a different technique has been developed using a combination of (a1) and (m2), to speed up the analysis processing rate. This technique, however, suffers from the problem that, since it employs a piecewise linear division method, fine segmentation is required when trying to improve the analysis accuracy. Accordingly, the processing rate becomes slow.

There has been introduced a switch level simulator. This switch level circuit simulator employs a combination of (a3) and (m3), to greatly increase the simulation processing rate. However, in this technique the aspect of transistor non-linear effects is neglected and, as a result, there is produced the problem of analysis accuracy.

In yet another technique, a semiconductor circuit with MOS transistors is analytically simulated using a combination of (a2) and (m1) in order that the processing accuracy and the processing rate become compatible. In accordance with this technique, the sub-operation of a target semiconductor circuit subjected to analysis processing is made by means of a circuit split and MOS transistor merge processing to result in a circuit equation about a single node. The circuit equation is analytically solved while at the same time adopting non-linear effects by devising MOS transistor models, to directly represent an output waveform by a time function expression, whereupon the processing accuracy and the processing rate become compatible. Such a method is illustrated in "ILLIADS: A Fast Timing and Reliability Simulator for Digital MOS Circuits," IEEE TRANSACTIONS ON COMPUTER-AIDED DESIGN OF INTEGRATED CIRCUITS AND SYSTEMS, Vol. 12, No. 19, September 1993 and in "Analytic Macromodeling and Simulation of Tightly-Coupled Mixed Analog-Digital Circuits," 1992 IEEE Conference on Computer-Aided Design.

The above-noted analysis methods, based on the (a2)-(m1) combination, are compared. The former analysis method is inferior to the latter analysis method because the channel length of MOS transistor is not considered in the former method. In both the methods, circuit equations are analytically solved and a node voltage is expressed by a time function expression, but it takes a very long time to evaluate such a complicated time function expression. Although these function expressions are not shown in the papers, they are shown in a paper entitled "Analytic Transient Solution of General MOS Circuit Primitives," IEEE TRANSACTIONS ON COMPUTER-AIDED DESIGN, Vol. 11, No. 6, June 1992, pp. 720–721 (Equations (7), (10), (11), (18), (19), (21)).

Originally, MOS transistors are characterized in that their threshold voltage varies depending on the substrate-source voltage. However, such a MOS transistor threshold voltage is dealt with as a fixed value in the above-described methods, as a result of which these conventional methods produce the problem that the simulation accuracy tends to drop when the substrate-source voltage greatly varies.

SUMMARY OF THE INVENTION

The present invention resolves the above-described problems with the prior art techniques. It is therefore a general object of the present invention to provide a high-speed, high-accuracy simulation method based upon the foregoing analytic simulation technique (a2). More specifically, in the present simulation method, consideration is given to the MOS transistor channel length and both the operating characteristics of MOS transistors with a long channel length and the operating characteristics of MOS transistors with a short channel length are represented with sufficient accuracy. In addition to the foregoing, functional expressions for node voltage are very simple and effects that the threshold voltage varies depending upon the substrate-source voltage are also included.

In the present invention, a MOS transistor operation area is divided into a plurality of sub-operation areas and the MOS transistor is represented in the form of a linear circuit in any one of the sub-operation areas. This arrangement facilitates a process of analyzing semiconductor circuits and represents the node voltage in a relatively simple time function expression. Additionally, the current of the electric current source is represented by a polynomial of the gate-source voltage of the MOS transistor so that operating characteristics of the MOS transistors with various channel lengths can be represented with sufficient accuracy. Further, the threshold voltage of the MOS transistor is represented by a polynomial of the substrate-source voltage so that variations in the threshold voltage can be represented with sufficient accuracy.

The present invention provides a MOS transistor characteristic representation method of representing an operating characteristic of a MOS transistor of a MOS transistor-containing semiconductor circuit by a MOS transistor model for use in analysis of the operating characteristic of the MOS transistor-containing semiconductor circuit. In this MOS transistor model:

(a) a drain-source interconnection of the MOS transistor is represented by a parallel circuit formed of an electric current source and a resistor;

(b) the current of the electric current source, expressed by letter i, is represented by a polynomial of a difference of $(V_{GS}-V_T)$ between the gate-source voltage of the MOS transistor, expressed by symbol $V_{GS}$, and the threshold voltage of the MOS transistor, expressed by symbol $V_T$;

(c) the operation area of the MOS transistor is divided into a plurality of sub-operation areas according to the gate-source and drain-source voltages of the MOS transistor;

coefficients contained in the polynomial of the current i have different values for the sub-operation areas; the resistor element have different conductances for the sub-operation areas; and (d) the threshold voltage $V_T$ is represented by a polynomial of the substrate-source voltage of the MOS transistor.

The present invention provides a semiconductor circuit characteristic analysis method for analyzing an operating characteristic of a MOS transistor-containing semiconductor circuit, the analysis method comprising the steps of:

(a) deriving, from a MOS transistor model according to the foregoing MOS transistor characteristic representation method, a circuit equation about the voltage or electric current of the MOS transistor-containing semiconductor circuit; and (b) thereafter solving the circuit equation whereby the operating characteristic of the semiconductor circuit is analyzed.

The present invention provides a semiconductor circuit characteristic analyzer for analyzing an operating characteristic of a MOS transistor-containing semiconductor circuit, the analyzer comprising:

(a) information input means for receiving interconnection information about the MOS transistor-containing semiconductor circuit;

(b) memory means for storing the interconnection information;

(c) processing means for obtaining, based on the interconnection information stored in the memory means, an equivalent circuit produced by replacing a MOS transistor of the MOS transistor-containing semiconductor circuit with a MOS transistor model according to the foregoing MOS transistor characteristic representation method;

(d) circuit equation derivation means for deriving a circuit equation about the voltage or electric current of the equivalent circuit; and (e) circuit equation analysis means for solving the circuit equation.

The present invention provides a memory medium for storing procedures that are transferred to a memory of a computer to have the computer execute predetermined processes wherein the memory medium stores (A) a procedure for deriving a circuit equation of a MOS transistor-containing semiconductor circuit from a MOS transistor model according to the foregoing MOS transistor characteristic representation method and (B) a procedure for solving the circuit equation.

The present invention provides a MOS transistor-containing semiconductor circuit wherein the MOS transistor-containing semiconductor circuit is designed in accordance with the forgoing semiconductor circuit characteristic analysis method.

In accordance with the present invention, both a MOS transistor with a long channel length and a MOS transistor with a short channel length can be represented with sufficient accuracy in operating characteristic.

Additionally, the node voltage can be represented by a simple equation. Further, consideration can be given to the threshold voltage variations associated with the substrate-source voltage variations.

The above-described objects and features of the present invention will become more apparent upon consideration of the following detailed description and the accompanying drawings.

BRIEF DESCRIPTION OF THE DRAWINGS

The following accompanying drawings show preferred embodiments of the present invention wherein.

DETAILED DESCRIPTION OF THE INVENTION

Preferred embodiments of the present invention are now illustrated with reference to the accompanying drawings.

FIRST EMBODIMENT

A first embodiment of this invention is described below.

Figure 1:
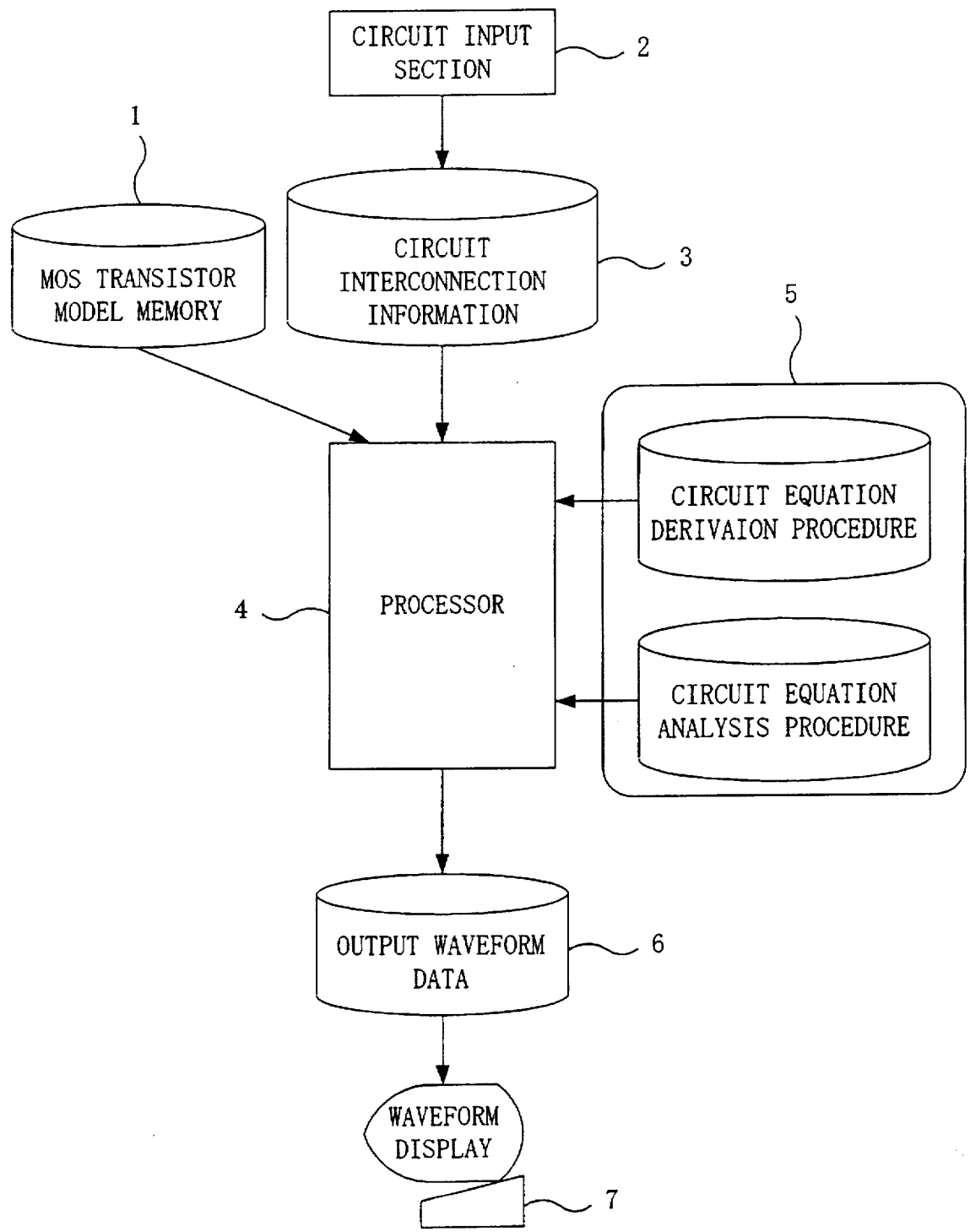
FIG. 1 shows the entire structure of a semiconductor circuit characteristic analyzer according to the present invention.
Figure 3A:
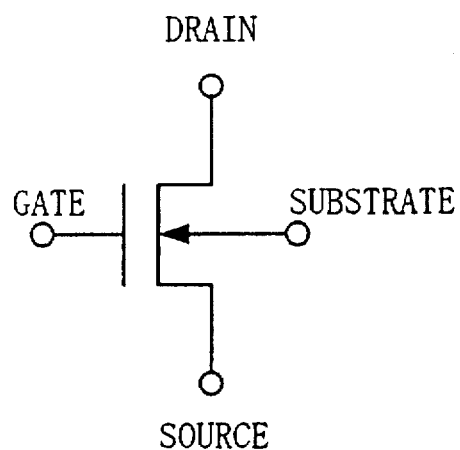
FIG. 3(a) is a diagram showing a MOS transistor structure and FIG. 3(b) is a diagram showing a MOS transistor basic model.

Referring first to FIG. 1, there is shown a MOS transistor model memory section 1. This memory section 1 stores a basic model of FIG. 3(b) as a basic model that corresponds to a MOS transistor of FIG. 3(a). In this basic model, a drain-source interconnection is represented by a parallel circuit formed of an electric current source 10 which supplies an electric current i and a resistor element 11 with a conductance of G. Additionally, in this basic model an interterminal (terminal-to-terminal) capacitor is added as needed, as a fixed capacitance, as shown by broken lines of FIG. 3(b).

In the above-described basic model of the present embodiment, the current, i, of the electric current source 10 is expressed by a quadratic polynomial of a difference $(V_{GS}-V_T)$ (the difference between $V_{GS}$ (the gate-source voltage of the MOS transistor) and $V_T$ (the predetermined threshold voltage)), as shown by Equation (1). $V_T$ is expressed by a cubic polynomial of $V_{BS}$ (the substrate-source voltage of the MOS transistor), as shown by Equation (2).

$$i = G_{m2}(V_{GS}-V_T)^2 + G_{m1}(V_{GS}-V_T) + G_{M0} \quad \text{Eq.(1)}$$

$$V_T = F_3 V_{BS}^3 + F_2 V_{BS}^2 + F_1 V_{BS} + F_0 \quad \text{Eq.(2)}$$

Figure 4:
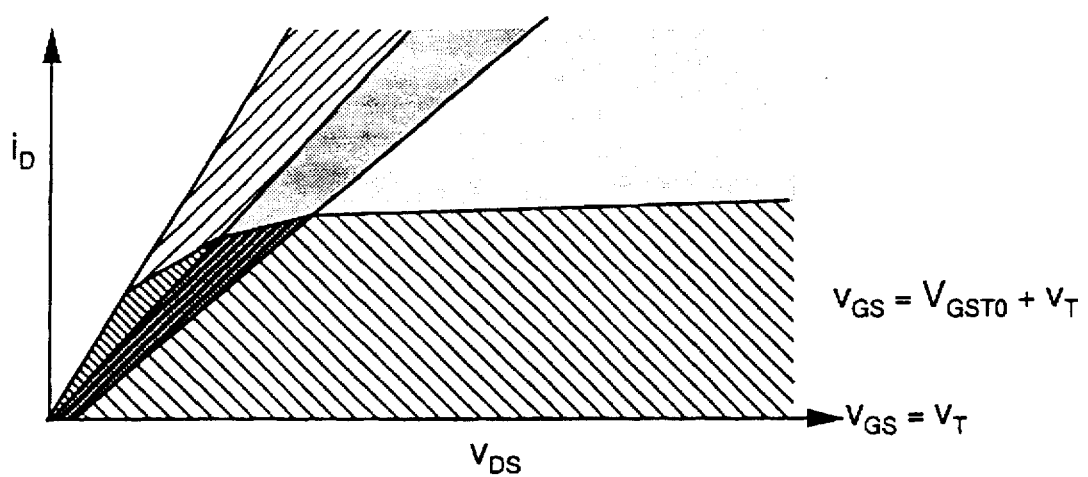
FIG. 4 shows the operation area and sub-operation areas of a basic model of a MOS transistor in accordance with the present invention.
Figure 5:
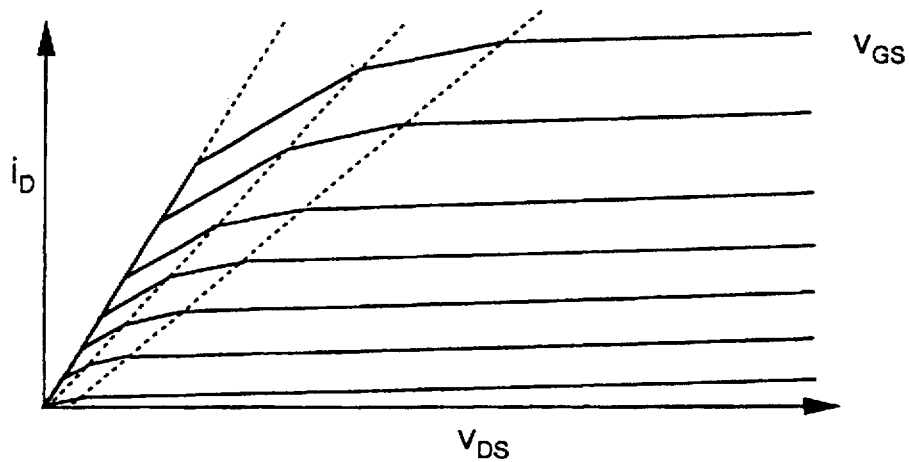
FIG. 5 shows the I-V characteristics of a MOS transistor according to a MOS transistor basic model of the present invention.

As shown in FIG. 4, G (the conductance of the resistor element 11), and $G_{m2}$, $G_{m1}$, $G_{m0}$ (the coefficients in Equation (1)) have their respective values for a plurality of sub-operation areas divided according to the MOS transistor terminal voltages ($V_{DS}$ (the drain-source voltage) and $V_{GS}$). When $V_{BS}$ changes, $V_T$ changes according to Equation (2). Correspondingly, each of the boundaries of the sub-operation areas of FIG. 4 changes. FIG. 5 shows the I-V characteristic of a MOS transistor according to this model.

Referring again to FIG. 1, there is shown a circuit input section 2 (information input means). This circuit input section 2 inputs interconnection information about a semiconductor circuit with MOS transistors that is subjected to analysis processing, e.g., a circuit shown in FIG. 4. This interconnection information is stored in a memory 3 (memory means).

Processor 4 is provided with a computer. This processor 4 derives, based on the interconnection information about a semiconductor circuit stored in the memory 3 and on the foregoing MOS transistor model, a circuit equation for that semiconductor circuit and analyzes the derived circuit equation, to obtain an output characteristic (output waveform) of the semiconductor circuit.

A storage medium 5 is provided for storing transferable programs to memory of the processor 4. Pre-stored within the storage medium 5 are (A) a general procedure according to which the processor 4 derives a circuit equation of an analysis-target semiconductor circuit to be analyzed and (B) a general procedure according to which the processor 4 solves the derived circuit equation.

Figure 2:
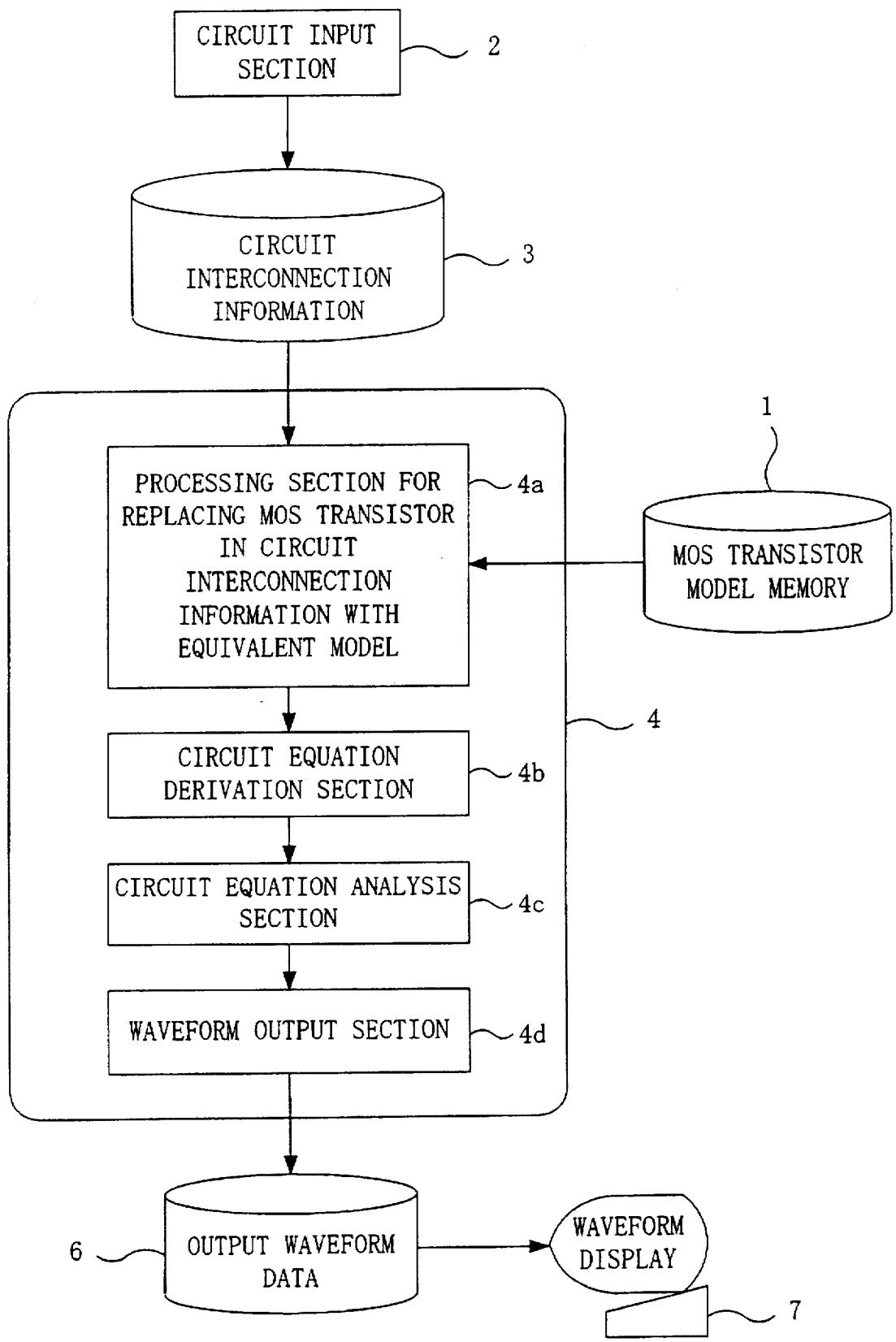
FIG. 2 outlines in block form the internal structure of a processor incorporated into a semiconductor circuit characteristic analyzer of the present invention.

FIG. 2 shows the internal structure of the processor 4. A processing section 4a gets semiconductor circuit interconnection information from the memory 3 and replaces, based on the interconnection information, a MOS transistor of a semiconductor circuit subjected to be analyzed with the foregoing MOS transistor model, to obtain an equivalent circuit thereto. For example, when an analysis-target semiconductor circuit is the FIG. 6(a) circuit, this circuit is replaced with the FIG. 6(b) equivalent circuit. The load capacitance $C_L$ of FIG. 6(b) is a sum of the load capacitance $C_L$ of FIG. 6(a) and the MOS transistor interterminal capacitance.

In the processor 4 of FIG. 2 also includes a circuit equation derivation section 4b (circuit equation derivation means). This derivation section 4b inputs the circuit equation derivation procedure stored in the memory medium 5 and derives, according to the derivation procedure, a circuit equation of the foregoing equivalent circuit. For example, with respect to the FIG. 4(b) equivalent circuit, the derivation section 4b derives a circuit equation expressed by the following Equation (3).

$$C\frac{dV_0}{dt} + i + G(V_0 - V_i) = 0 \quad \text{Eq. (3)}$$

Processor 4 also includes a circuit equation analysis section 4c (circuit equation analysis means). This analysis section 4c inputs the circuit equation analysis procedure stored in the memory medium 5 and analyzes, according to the analysis procedure, the aforesaid derived equivalent circuit. For instance, the analysis section 4c, taking $V_i$ (the input voltage in Equation (3)) as a piecewise linear waveform represented by the following Equation (4), translates Equation (3) into a linear differential equation (Equation (5)) and solves the linear differential equation to calculate $V_o$ (the circuit output voltage) (see Equation (6)).

$$V_i = A_i t + B \quad \text{Eq.(4)}$$

$$dV_0/dt = K_V V_0 + K_6 t^6 + K_5 t^5 + K_4 t^4 + K_3 t^3 + K_2 t^2 + K_1 t^1 + K_0 \quad \text{Eq.(5)}$$

$$V_0 = \left( \frac{1}{K_7^7} \sum_{P=0}^{6} P! K_V^{-P} K_P + V_{00} \right) e^{\frac{K_t}{V}} - \sum_{q=0}^{6} \frac{t^q}{q! K_V^{7-q}} \sum_{P=q}^{6} P! K_V^{-P} K_P \quad \text{Eq. (6)}$$

$K_v$, and $K_0-K_6$, which are coefficients in Equation (6), are expressed by the following Equations (7).

$$K_V = -\frac{G}{C}$$

$$K_6 = -\frac{1}{C} G_{m2} A^6 F_3^2$$

$$K_5 = -\frac{1}{C} 2 G_{m2} A^5 F_3 (3 BF_3 - F_2)$$

$$K_4 = -\frac{1}{C} G_{m2} A^4 (2 F_3(F_1 - BF_2 - 1) + (F_2 - 3 BF_3)(F_2 - 5 BF_3))$$

$$K_3 = -\frac{1}{C} A^3 (G_{m1} F_3 - 2 G_{m2}((F_2 - 4 BF_3)(F_1 - 2 BF_2 +$$

$$2 B^2 F_3 - 1) + F_3(F_0 - 2 B^3 F_3 - V_{DD})))$$

$$K_2 = -\frac{1}{C} A^2((3 BF_3 - F_2)(G_{m1} + G_{m2}(2 V_{DD} + 4 B (F_1 -$$

$$BF_2 - 1) - 2 F_0 - B^2(F_2 - 5 BF))) - G_{m2}(F_1 - BF_2 - 1)^2)$$

$$K_1 = -\frac{1}{C} A (-G + (1 + F_1 + 2 BF_2 - 3 B^2 F_3)(2 G_{m2}(B +$$

$$F_0 - BF_1 + B^2 F_2 - B^3 F_3 - V_{DD}) + G_{m1}))$$

$$K_0 = -\frac{1}{C} (G_{m0} - G B - G_{m1}(B + F_0 - BF_1 + B^2 F_2 -$$

$$B^3 F_3 - V_{DD}) + G_{m2}(B + F_0 - BF_1 + B^2 F_2 - B^3 F_3 - V_{DD})^2)$$

The circuit equation analysis section 4c switches the value of each parameter G, Gm0, Gm1, Gm2, A and B in Equation (6) according to each transistor sub-operation area and the switch time of $V_i$ (the piecewise linear input waveform) while at the same time analytically solving $V_o$ (the output voltage expressed by Equation (6)) without having to depend upon any numeric computational solving techniques.

The processor 4 shown in FIG. 2, also includes a waveform output section 4c. This waveform output section 4d provides an output Vo (the output voltage waveform) produced by the circuit equation analysis section 4c to outside of the processor 4. This output Vo is stored in an output waveform data memory 6 and is displayed by a display unit 7 as needed.

In accordance with the present embodiment, a MOS transistor drain-source interconnection is represented by a parallel circuit of an electric current source 10 and a resistor 11, and a MOS transistor operation area is divided into a plurality of sub-operation areas so that in any one of the sub-operation areas a MOS transistor can be represented as a linear circuit formed by such a parallel circuit. This considerably facilitates a process of analyzing semiconductor circuits and the time function expression of $V_o$ can be obtained in the form of a simple function expression such as Equation (6) in relation to commonly-used function expressions. Accordingly, the analysis rate is increased.

In addition to such advantages, i (the current of the electric current source 10 that is an element of the parallel circuit) can be expressed by a quadratic polynomial of ($V_{GS}$-$V_T$) (see Equation (1)). This makes it possible to represent the operating characteristics of MOS transistors with different channel lengths with sufficient accuracy. Further, $V_T$ (the MOS transistor threshold voltage) can be expressed by a cubic polynomial of $V_{BS}$ (see Equation (2)), thereby making it possible to accurately represent variations in $V_T$. Accordingly, the present embodiment is able to analyze the operations of MOS transistor-containing semiconductor circuits.

SECOND EMBODIMENT

A second embodiment of the present invention is now illustrated.

Figure 3B:
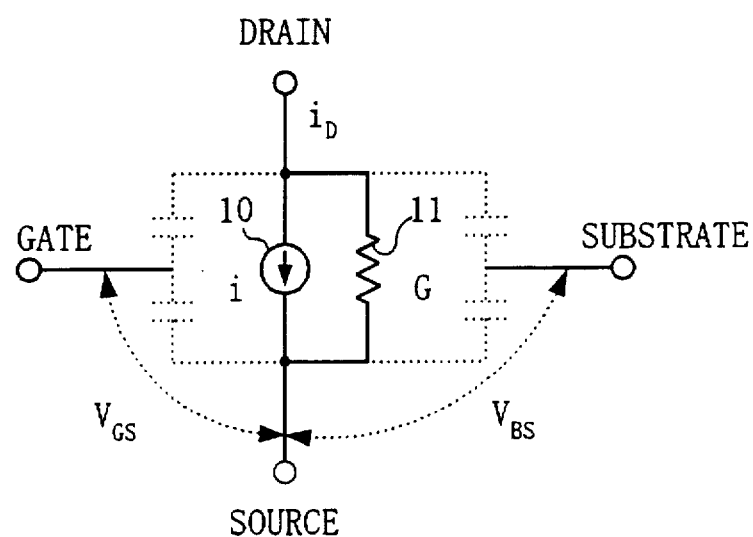

Like the first embodiment, the FIG. 3(b) model is used as a MOS transistor basic model. Here, i (the current of the electric current source 10) is also represented by a quadratic polynomial of ($V_{GS}$-$V_T$) (see Equation (1)).

In the present embodiment, $V_T$ is represented by a linear polynomial of $V_{BS}$ as shown in the following Equation (8).

$$V_T = F_1 V_{BS} + F_0 \qquad \text{Eq.(8)}$$

Like the first embodiment, G, and $G_{m2}$, $G_{m1}$, $G_{m0}$ in the relational expression of i and $V_{GS}$ have their respective values for a plurality of sub-operation areas divided according to the MOS transistor terminal voltages ($V_{DS}$ (the drain-source voltage and $V_{GS}$), as shown in FIG. 4. When $V_{BS}$ changes, $V_T$ changes according to Equation (8). Correspondingly, each of the boundaries of the sub-operation areas of FIG. 4 changes. FIG. 5 shows the I-V characteristic of a MOS transistor according to this model.

Figure 6A:
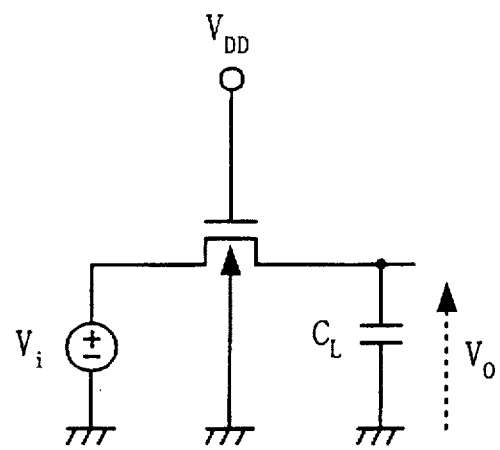
FIG. 6(a) is an example semiconductor circuit to be analyzed and FIG. 6(b) is an equivalent circuit to the FIG. 6(a) circuit represented in accordance with a MOS transistor basic model of the present invention.
Figure 6B:
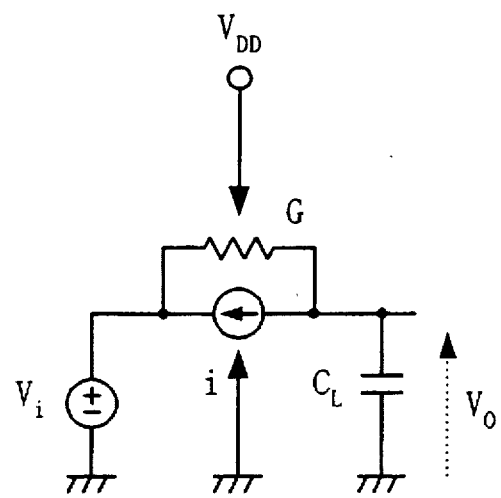

Replacement of the semiconductor circuit shown in FIG. 6(a) with the aforesaid model results in producing the equivalent circuit shown in FIG. 6(b), which is the same as in the first embodiment. Here, the load capacitance $C_L$ of FIG. 6(b) is a sum of the load capacitance $C_L$ of FIG. 6(a) and the interterminal capacitance of the MOS transistor.

A circuit equation of the FIG. 4(b) equivalent circuit may be expressed by Equation (3), as in the first embodiment. For example, if Vi (the input voltage of this semiconductor circuit) is taken as a piecewise linear input waveform which is expressed by Equation (4), then the Eq. (3) circuit equation is represented by a linear differential equation (Equation (9)).

$$\frac{dV_0}{dt} = K_V V_0 + K_2 t^2 + K_1 t + K_0 \qquad \text{Eq. (9)}$$

$V_o$ (the output voltage of Equation (3)) can analytically be solved without having to depend upon any numeric computational solving techniques and is expressed by the following Equation (10). $K_v$ and $K_0$–$K_2$, which are coefficients of Equation (10), are given by the following Equations (11).

$$V_0 = \left( \frac{1}{K_V^3} \sum_{P=0}^{2} P! K_V^{2-P} K_P + V_{00} \right) e^{\frac{K_t}{V}} - \qquad \text{Eq. (10)}$$

$$\sum_{q=0}^{2} \frac{t^q}{q! K_V^{2-q}} \sum_{P=q}^{2} P! K_V^{2-P} K_P$$

$$K_V = -\frac{G}{C} \qquad \text{Eq. (11)}$$

$$K_2 = -\frac{A^2 G_{m2}}{C} (F_1 - 1)^2$$

$$K_1 = -\frac{A}{C} ((F_1 - 1)(G_{m1} - 2G_{m2}(F_0 - B(F_1 - 1) - V_{DD})) - G)$$

$$K_0 = -\frac{1}{C} (G_{m0} - G_{m1}(F_0 - B(F_1 - 1)) +$$

$$G_{m2}(F_0 - B(F_1 - 1) - V_{DD})^2 + G_{m1} V_{DD} - GB)$$

Here, the value of each of parameters G, Gm0, Gm1, Gm2, A and B of Equation (11) is switched according to the transistor sub-operation area and the switch time of $V_i$ (the piecewise linear input waveform). Additionally, $F_1$ and $F_0$, which are coefficients of Equation (8), are precisely re-calculated when a transistor sub-operation area is switched to another. For example, if Equation (12), which is an arithmetic expression of the threshold voltage ($V_T$) of a MOS transistor model BSIM1 of a general circuit simulator SPICE, is series-expanded as shown in Equation (13) and if up-to-linear coefficients of $V_{BS}$ are $F_1$ and $F_0$, then the $V_T$ is given by the following Equation (14). These coefficients $F_1$ and $F_0$ are re-calculated using this Equation (14) every time a transistor sub-operation area is switched to another.

$$V_T = V_{FB} + \phi_S + K_{BE}\sqrt{\phi_S - V_{BS}} - K_{DCS}(\phi_S - V_{BS}) - \eta V_{DS} \qquad \text{Eq. (12)}$$

$$V_T = \sum_{i=0}^{\infty} F_i V_{BS}^i - \eta V_{DS}^V \qquad \text{Eq. (13)}$$

$$V_T \fallingdotseq F_0 + F_1 V_{BS} \qquad \text{Eq.(14)}$$

THIRD EMBODIMENT

A third embodiment of the present invention is illustrated.

Like the first embodiment, the FIG. 3(b) model is used as a MOS transistor basic model. Here, i (the current of the electric current source 10) is also represented by a quadratic polynomial of ($V_{GS}$-$V_T$) (see Equation (1)). $V_T$ is represented by a linear expression of $V_{BS}$ (see Equation (8)) as in the second embodiment.

Like the first and second embodiments, G, and $G_{m2}$, $G_{m1}$, $G_{m0}$ in the relational expression of i and $V_{GS}$ have their respective values for a plurality of sub-operation areas divided according to the MOS transistor terminal voltages ($V_{DS}$ (the drain-source voltage and $V_{GS}$), as shown in FIG. 4. When $V_{BS}$ changes, $V_T$ changes according to Equation (8). Correspondingly, each of the boundaries of the sub-operation areas of FIG. 4 changes. FIG. 5 shows the I-V characteristic of a MOS transistor according to this model.

Replacement of the semiconductor circuit shown in FIG. 6(a) with the aforesaid model results in producing the equivalent circuit shown in FIG. 6(b). Here, the load capacitance $C_L$ of FIG. 6(b) is a sum of the load capacitance $C_L$ of FIG. 6(a) and the interterminal capacitance of the MOS transistor, as in the first and second embodiments.

A circuit equation for the FIG. 4(b) equivalent circuit may be expressed by Equation (3), as in the first embodiment. For example, if Vi (the input voltage of this semiconductor circuit) is taken as a piecewise linear input waveform which is expressed by Equation (4), then the Eq. (3) circuit equation is represented by a linear differential equation (Equation (9)), as in the second embodiment. $V_o$ (the output voltage of the equivalent circuit) can analytically be solved without having to depend upon any numeric computational solving techniques and is expressed by Equation (10). $K_v$ and $K_0$–$K_2$, which are coefficients of Equation (10), are expressed by Equations (11).

Figure 7:
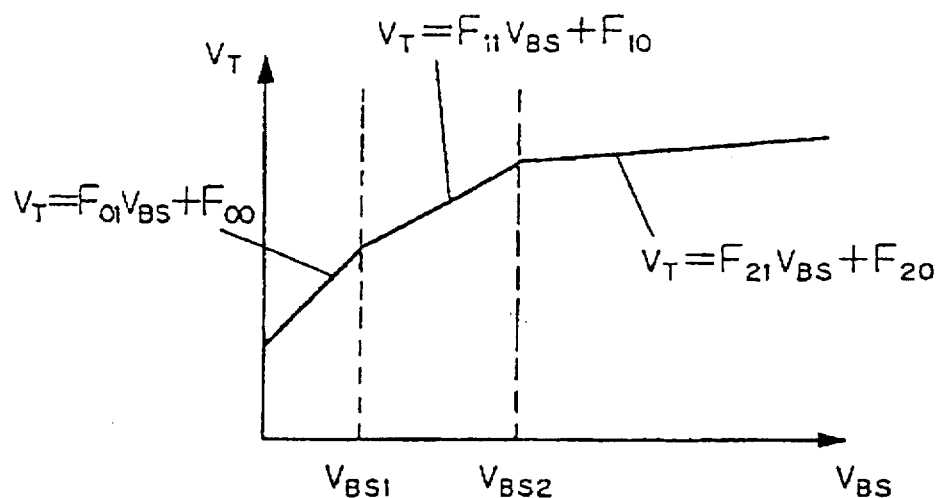
FIG. 7 is a diagram useful in understanding a case in which a relational expression representing a relationship between the threshold voltage and substrate-source voltage is switched according to the substrate-source voltage.
Figure 8:
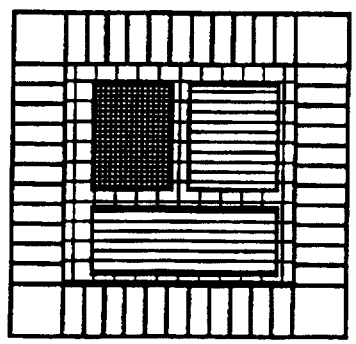
FIG. 8 is a diagram depicting a semiconductor circuit designed by means of a semiconductor circuit characteristic analysis method of the present invention.

Here, the value of each of parameters G, Gm0, Gm1, Gm2, A and B in Equation (11) is switched according to the transistor sub-operation area and the switch time of $V_i$ (the piecewise linear input waveform). Additionally, $F_1$, and $F_0$, which are coefficients of Equation (8), are presorted in a table with classification by $V_{BS}$ in order that the relationship between $V_T$ and $V_{GS}$ shows the FIG. 7 characteristics. When a transistor sub-operation area is switched to another, the values of $F_1$ and $F_0$ are updated by referring, based on the value of $V_{BS}$ at the time of the sub-operation area switch, to the table.

In the first and third embodiments, whereas the relationship between i and ($V_{GS}$–$V_T$) is given by Equation (1), the relationship between $V_T$ and $V_{BS}$ is given by Equation (2) or Equation (8). These relational expressions are generally given by the following equations.

$$i = \sum_{p=0}^{n} G_{mp}(V_{GS} - V_T)^p \qquad \text{Eq. (15)}$$

$$V_T = \sum_{p=0}^{k} F_p \cdot V_{BS}^p \qquad \text{Eq. (16)}$$

Also in this case, if Vi, i.e., the semiconductor circuit input voltage, is a piecewise linear input waveform, then the following Equation (17) is given as a circuit equation that can analytically be solved. $V_o$, i.e., the output voltage, is given by the following Equation (18).

$$\frac{dV_0}{dt} = K_V V_0 + \sum_{p=0}^{n*k} K_p t^p \qquad \text{Eq. (17)}$$

$$V_0 = \left( \frac{1}{K_V^{n*k+1}} \sum_{p=0}^{n*k} p! K_V^{n*k-p} K_p + V_{00} \right) e^{K_V t} - \sum_{q=0}^{n*k} \frac{t^q}{q! K_V^{n*k-q+1}} \sum_{p=q}^{n*k} p! K_V^{n*k-p} K_p \qquad \text{Eq. (18)}$$

Therefore, with regard to the relational expression of i and ($V_{GS}$–$V_T$), i may be expressed, as shown in the following Equation (19), by a cubic polynomial.

$$i = G_{m3}(V_{GS}-V_T)^3 + G_{m2}(V_{GS}-V_T)^2 + G_{m1}(V_{GS}-V_T) + G_{m0} \qquad \text{Eq.(19)}$$

In the description of each of the above-described embodiments, the interterminal capacitance of the MOS transistor is fixed. However, if effects of the dependence of the capacitance on the MOS transistor interterminal voltage are to be included, this inclusion can be achieved by means of the setting of different capacitances for the individual sub-operation areas of FIG. 4.

As described above, in accordance with the present invention, the MOS transistor operating characteristic can be represented with sufficient accuracy in relation to the conventional techniques. As a result, the operation of semiconductor circuits with MOS transistors can be analyzed with sufficient accuracy. It is possible to design a semiconductor circuit with desirable operating characteristics.

What is claimed is:

1. A MOS transistor characteristic representation method of representing an operating characteristic of a MOS transistor of a MOS transistor-containing semiconductor circuit by a MOS transistor model for use in analysis of an operating characteristic of said MOS transistor-containing semiconductor circuit wherein in said MOS transistor model:

(a) a drain-source interconnection of said MOS transistor is represented by a parallel circuit formed of an electric current source and a resistor;

(b) the current of said electric current source, expressed by letter i, is represented by a polynomial of a difference of ($V_{GS}$–$V_T$) between the gate-source voltage of said MOS transistor, expressed by symbol $V_{GS}$, and the threshold voltage of said MOS transistor, expressed by symbol $V_T$;

(c) the operation area of said MOS transistor is divided into a plurality of sub-operation areas according to the gate-source and drain-source voltages of said MOS transistor;

coefficients contained in said polynomial of said current i have different values for said sub-operation areas;

said resistor element have different conductances for said sub-operation areas; and (d) said threshold voltage $V_T$ is represented by a polynomial of the substrate-source voltage of said MOS transistor.

2. The MOS transistor characteristic representation method according to claim 1 wherein a polynomial which represents a relationship between said current i and said difference ($V_{GS}$–$V_T$) is an n-th degree expression where the number n is an arbitrary integer, said i–($V_{GS}$–$V_T$) relationship representing polynomial being represented by the following expression:

$$i = \sum_{p=0}^{n} G_{mp}(V_{GS} - V_T)^p,$$

where said $G_{mp}$ is a given coefficient.

3. The MOS transistor characteristic representation method according to claim 2, wherein:

said arbitrary integer n is two (n=2);

said i–($V_{GS}$–$V_T$) relationship representing polynomial is represented by the following expression:

$$i = G_{m2}(V_{GS}-V_T)^2 + G_{m1}(V_{GS}-V_T) + G_{m0}.$$

4. The MOS transistor characteristic representation method according to claim 2, wherein:

said arbitrary integer n is three (n=3);

said i–($V_{GS}$–$V_T$) relationship representing polynomial is represented by the following expression:

$$i=G_{m3}(V_{GS}-V_T)^3+G_{m2}(V_{GS}-V_T)^2+G_{m1}(V_{GS}-V_T)+G_{m0}.$$

5. The MOS transistor characteristic representation method according to claim 1 wherein a polynomial which represents a relationship between said threshold voltage $V_T$ and said substrate-source voltage $V_{BS}$ is a k-th degree expression where the number k is an arbitrary integer, said $V_T$-$V_{BS}$ relationship representing polynomial being represented by the following expression:

$$V_T = \sum_{p=0}^{k} F_p \cdot V_{BS}^p,$$

where said $F_p$ is a given coefficient.

6. The MOS transistor characteristic representation method according to claim 5, wherein:

said arbitrary integer k is three (k=3);

said $V_T$-$V_{BS}$ relationship representing polynomial is represented by the following expression:

$$V_T = F_3 V_{BS}^3 + F_2 V_{BS}^2 + F_1 V_{BS} + F_0.$$

7. The MOS transistor characteristic representation method according to claim 5, wherein:

said arbitrary integer k is one (k=1); and said $V_T$-$V_{BS}$ relationship representing polynomial being represented by the following expression:

$$V_T = F_1 V_{BS} + F_0.$$

8. The MOS transistor characteristic representation method according to claim 1 wherein the variation range of the substrate-source voltage, expressed by symbol $V_{BS}$, of said MOS transistor is divided into a plurality of sub-ranges for each said sub-operation area and wherein each said sub-range is assigned a respective coefficient of a polynomial representing a relationship of said threshold voltage $V_T$ and said substrate-source voltage $V_{BS}$.

9. A semiconductor circuit characteristic analysis method for analyzing an operating characteristic of a MOS transistor-containing semiconductor circuit, said analysis method comprising the steps of:

(a) deriving, from a MOS transistor model according to claim 1 or claim 8, a circuit equation about the voltage or electric current of said MOS transistor-containing semiconductor circuit; and (b) thereafter solving said circuit equation whereby an operating characteristic of said semiconductor circuit is analyzed.

10. The semiconductor circuit characteristic analysis method according to claim 9 wherein coefficients of a polynomial representing a relationship between the threshold voltage of said MOS transistor model, expressed by symbol $V_T$, and the substrate-source voltage of said MOS transistor model, expressed by symbol $V_{BS}$, are recalculated to be set every time the sub-operation area of a MOS transistor of said MOS transistor-containing semiconductor circuit is switched.

11. A semiconductor circuit characteristic analyzer for analyzing an operating characteristic of a MOS transistor-containing semiconductor circuit, said analyzer comprising:

(a) information input means for receiving interconnection information about said MOS transistor-containing semiconductor circuit;

(b) memory means for storing said interconnection information;

(c) processing means for obtaining, based on said interconnection information stored in said memory means, an equivalent circuit produced by replacing a MOS transistor of said MOS transistor-containing semiconductor circuit with a MOS transistor model according to claim 1 or claim 8;

(d) circuit equation derivation means for deriving a circuit equation about the voltage or electric current of said equivalent circuit; and (e) circuit equation analysis means for solving said circuit equation.

12. A memory medium for storing procedures that are transferred to a memory of a computer to have said computer execute predetermined processes, said memory medium storing a procedure for deriving a circuit equation of a MOS transistor-containing semiconductor circuit from a MOS transistor model according to claim 1 or claim 8;

said memory medium storing a procedure for solving said circuit equation.

13. A MOS transistor-containing semiconductor circuit wherein said MOS transistor-containing semiconductor circuit is designed in accordance with the semiconductor circuit characteristic analysis method of claim 9.

14. A MOS transistor-containing semiconductor circuit wherein said MOS transistor-containing semiconductor circuit is designed in accordance with the semiconductor circuit characteristic analysis method of claim 10.

* * * * *

UNITED STATES PATENT AND TRADEMARK OFFICE
CERTIFICATE OF CORRECTION

PATENT NO. : 5,757,679
DATED : May 26, 1998
INVENTOR(S) : SAWAI et al.

It is certified that error appears in the above-identified patent and that said Letters Patent is hereby corrected as shown below:

Col. 11, line 10: Change "$V^P{}_{BS}$" to --$V_{BS}{}^P$--

Signed and Sealed this

Twenty-seventh Day of October, 1998

*Attest:*

BRUCE LEHMAN

*Attesting Officer*   *Commissioner of Patents and Trademarks*